(12) United States Patent
Chen et al.

(10) Patent No.: US 10,847,969 B2
(45) Date of Patent: Nov. 24, 2020

(54) CONSTANT POWER PROTECTION CIRCUIT AND CONSTANT POWER PROTECTION METHOD

(71) Applicant: Chicony Power Technology Co., Ltd., New Taipei (TW)

(72) Inventors: Ping-Sheng Chen, New Taipei (TW); Tso-Jen Peng, New Taipei (TW)

(73) Assignee: CHICONY POWER TECHNOLOGY CO., LTD., New Taipei (TW)

( * ) Notice: Subject to any disclaimer, the term of this patent is extended or adjusted under 35 U.S.C. 154(b) by 308 days.

(21) Appl. No.: 16/103,902

(22) Filed: Aug. 14, 2018

(65) Prior Publication Data

US 2019/0372336 A1 Dec. 5, 2019

(30) Foreign Application Priority Data

Jun. 4, 2018 (TW) .............................. 107119213 A (51) Int. Cl.
*H02H 9/00* (2006.01)
*G01R 19/165* (2006.01)
*H02H 1/00* (2006.01)

(52) U.S. Cl.
CPC .......... *H02H 9/00* (2013.01); *G01R 19/16523* (2013.01); *G01R 19/16528* (2013.01); *H02H 1/0007* (2013.01)

(58) Field of Classification Search
CPC .... H02M 3/156; H02M 3/158; H02M 3/1588; H02M 3/155; H02M 3/1582; H02M 3/157; H02M 3/1563; H02M 3/1584; H02M 1/12; H02M 1/42; H02M 1/4225; H02M 1/4233; H02M 1/4241; H02M 1/4258; H02M 1/425; H02M 1/4208; H02M 2001/4283; H02M 2001/4291; H02M 2003/1552; H02H 1/0007; H02H 1/0061; H02H 1/0084; H02H 1/0092; H02H 3/087; H02H 3/006;
(Continued)

(56) References Cited

U.S. PATENT DOCUMENTS 5,739,596 A 4/1998 Takizawa et al.
6,172,884 B1 1/2001 Lanni
(Continued)

FOREIGN PATENT DOCUMENTS

CN 1641962 A 7/2005
CN 1917322 A 2/2007
(Continued)

*Primary Examiner* — Bryan R Perez
(74) *Attorney, Agent, or Firm* — CKC & Partners Co., LLC (57) ABSTRACT

A constant power protection circuit includes a voltage conversion circuit, a current detection circuit, a voltage detection circuit, a power setting circuit, a voltage feedback circuit, an addition circuit, a current feedback circuit, and a signal isolation unit. When an output voltage of the voltage conversion circuit is larger than a voltage of the voltage detection circuit and an output current of the voltage conversion circuit is larger than a current of the current detection circuit, the power setting circuit provides a comparison signal to the current feedback circuit, the current feedback circuit outputs a feedback signal to the signal isolation unit. According to a signal outputted from the signal isolation unit, the voltage conversion circuit enables a constant power mode.

11 Claims, 5 Drawing Sheets

(58) Field of Classification Search
CPC ........ H02H 3/025; H02H 3/042; H02H 3/044; H02H 3/06; H02H 3/08; H02H 3/22; H02H 9/046; H02H 7/085; H02H 7/18
See application file for complete search history.

(56) References Cited

U.S. PATENT DOCUMENTS

| | | | | |
|---|---|---|---|---|
| 6,249,411 | B1* | 6/2001 | Hemena | H02J 1/108 |
| | | | | 361/18 |
| 7,224,086 | B2 | 5/2007 | Germagian et al. | |
| 2006/0238138 | A1 | 10/2006 | Quazi | |
| 2012/0099345 | A1* | 4/2012 | Zhao | H02M 1/36 |
| | | | | 363/21.05 |

FOREIGN PATENT DOCUMENTS

| | | |
|---|---|---|
| CN | 201854494 U | 6/2011 |
| CN | 101893909 B | 8/2012 |
| CN | 105811770 B | 5/2018 |
| TW | 201133217 A | 10/2011 |
| TW | 201145782 A1 | 12/2011 |
| TW | I358182 B | 2/2012 |
| TW | 201415191 A | 4/2014 |
| TW | 201415776 A | 4/2014 |
| TW | 201545448 A | 12/2015 |
| TW | I514735 B | 12/2015 |

\* cited by examiner

CONSTANT POWER PROTECTION CIRCUIT AND CONSTANT POWER PROTECTION METHOD

RELATED APPLICATIONS

This application claims priority to Taiwan Application Serial Number 107119213, filed Jun. 4, 2018, which is herein incorporated by reference.

BACKGROUND OF THE INVENTION

Field of Invention

The present invention relates to a protection circuit and a method. More particularly, the present invention relates to a constant power protection circuit and a constant power protection circuit method.

Description of Related Art

In the conventional technology, power supply devices can adjust its output mode among different output modes according to values of voltage and current outputted by the power supply devices. Output modes of most of the power supply devices are constant voltage mode or constant current mode.

No matter what output mode is adopted by the power supply devices (i.e., the power supply devices may adopt a constant voltage or a constant current mode), the power supply devices cannot provide constant power. As a result, how to let the power supply devices provide constant power is a problem to be improved in the field.

SUMMARY OF THE INVENTION

The following presents a simplified summary of the disclosure in order to provide a basic understanding to the reader. This summary is not an extensive overview of the disclosure and it does not identify key/critical elements of the present invention or delineate the scope of the present invention.

One aspect of the present disclosure is directed to a constant power protection circuit. The constant power protection circuit comprises a voltage conversion circuit, a current detection circuit, a voltage detection circuit, a power setting circuit, a voltage feedback circuit, an addition circuit, a current feedback circuit, and a signal isolation unit. The voltage conversion circuit is configured to provide an output voltage to a load. The current detection circuit is coupled to the voltage conversion circuit, and configured to detect an output current of the load. The voltage detection circuit is coupled to the current detection circuit and the voltage conversion circuit. The power setting circuit is coupled to the voltage detection circuit. The voltage feedback circuit is coupled to the voltage detection circuit. The addition circuit is coupled to the power setting circuit. The current feedback circuit is coupled to the addition circuit. The signal isolation unit is coupled to the voltage feedback circuit and the current feedback circuit. When the output voltage is larger than a voltage of the voltage detection circuit and the output current is larger than a current of the current detection circuit, the power setting circuit provides a comparison signal to the current feedback circuit, the current feedback circuit outputs a feedback signal to the signal isolation unit, and the voltage conversion circuit enables a constant power mode according to a signal outputted from the signal isolation unit.

Another aspect of the present disclosure is directed to a constant power protection method. The constant power protection method is applied to a constant power protection circuit. The constant power protection circuit comprises a voltage conversion circuit, a current detection circuit, a voltage detection circuit, a current feedback circuit, and a signal isolation unit. The voltage detection circuit is coupled to the current detection circuit and the voltage conversion circuit, the current feedback circuit is coupled to the voltage detection circuit and the current detection circuit, and the signal isolation unit is coupled to the current feedback circuit. The constant power protection method comprises steps of: providing an output voltage to a load by the voltage conversion circuit; detecting an output current of the load by the current detection circuit; providing a comparison signal to the current feedback circuit when the output voltage is larger than a voltage of the voltage detection circuit and the output current is larger than a current of the current detection circuit; and outputting a feedback signal to the signal isolation unit by the current feedback circuit, wherein the voltage conversion circuit enables a constant power mode according to a signal outputted by the signal isolation unit.

These and other features, aspects, and advantages of the present invention, as well as the technical means and embodiments employed by the present invention, will become better understood with reference to the following description in connection with the accompanying drawings and appended claims.

BRIEF DESCRIPTION OF THE DRAWINGS

The invention can be more fully understood by reading the following detailed description of the embodiment, with reference made to the accompanying drawings as follows.

In accordance with common practice, the various described features/elements are not drawn to scale but instead are drawn to best illustrate specific features/elements relevant to the present invention. Also, wherever possible, like or the same reference numerals are used in the drawings and the description to refer to the same or like parts.

DETAILED DESCRIPTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

Unless otherwise defined herein, scientific and technical terminologies employed in the present disclosure shall have the meanings that are commonly understood and used by one of ordinary skill in the art. Unless otherwise required by context, it will be understood that singular terms shall include plural forms of the same and plural terms shall include singular forms of the same.

Figure 1:
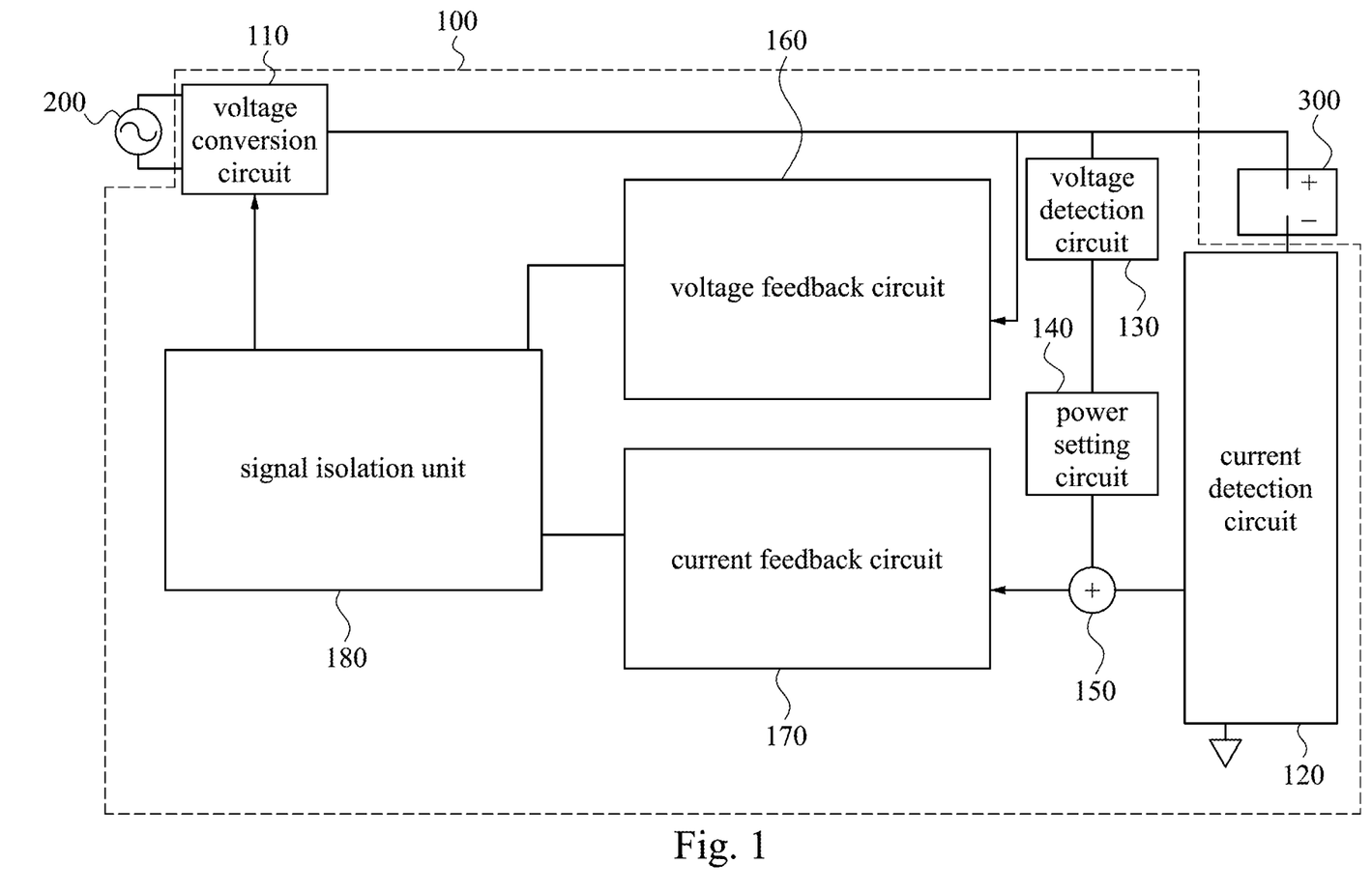
FIG. 1 is a circuit block diagram of a constant power protection circuit according to some embodiments of the present disclosure.

FIG. 1 is a block diagram of a constant power protection circuit 100 according to some embodiments of the present disclosure. As shown in FIG. 1, a constant power protection circuit 100 includes a voltage conversion circuit 110, a current detection circuit 120, a voltage detection circuit 130, a power setting circuit 140, an addition circuit 150, a voltage feedback circuit 160, a current feedback circuit 170, and a signal isolation unit 180.

The connection of the constant power protection circuit 100 as shown in FIG. 1 is as follow. The current detection circuit 120 is coupled between the voltage conversion circuit 110 and the addition circuit 150. The voltage detection circuit 130 is coupled to the current detection circuit 120 and the voltage conversion circuit 110. The power setting circuit 140 is coupled to the voltage detection circuit 130 and the addition circuit 150. The voltage feedback circuit 160 is coupled to the voltage conversion circuit 110. The signal isolation unit 180 is coupled to the voltage feedback circuit 160 and the current feedback circuit 170. The signal isolation unit 180 is coupled to the voltage conversion circuit 110.

Reference is now made to FIG. 1. The voltage conversion circuit 110 provides an output voltage to a load 300. After the voltage conversion circuit 110 receives an alternative current (AC) power provided by an AC power 200, the voltage conversion circuit 110 transforms the AC power into a direct current (DC) power and provides the DC power to the load 300. In one embodiment, the voltage conversion circuit 110 can be but not limited to an Isolated flyback converter, a LLC converter, a buck-boost converter or other voltage conversion circuits which can transform the AC power into DC power.

Reference is now made to FIG. 1. The current detection circuit 120 is configured to detect an output current of the load 300. When the output current is larger than a predetermined current of the current detection circuit 120, the current detection circuit 120 generates a comparison signal and transmits to the addition circuit 150. Subsequently, the addition circuit 150 transmits the comparison signal to the current feedback circuit 170, and a current feedback mode is activated. In one embodiment, the predetermined current can be set according actual requirements.

The voltage detection circuit 130 is configured to detect an output voltage of the voltage conversion circuit 110. When the output voltage of the voltage conversion circuit 110 is larger than a predetermined voltage of the voltage detection circuit 130, the power setting circuit 140 provides the comparison signal to the addition circuit 150. The addition circuit 150 not only receives the comparison signal of the current detection circuit 120, but also receives the comparison signal provided by the power setting circuit 140. As such, the addition circuit 150 outputs a larger comparison signal to the current feedback circuit 170, such that the current feedback mode is activated in advance.

As a result, when the load 300 becomes larger, the output voltage will be decreased linearly, and the comparison signal provided by the power setting circuit 140 becomes lower (i.e., the current flows through the power setting circuit 140 becomes lower). In this situation, the output current becomes larger, such that a product of the output voltage and the output current is a constant value, so as to achieve a constant power mode.

As shown in FIG. 1, the signal isolation unit 180 is configured to prevent the voltage feedback circuit 160 and the current feedback circuit 170 from interrupting each other, and transmit a feedback signal received by the voltage feedback circuit 160 or the current feedback circuit 170 to the voltage conversion circuit 110. When the voltage feedback circuit 160 outputs the feedback signal, the signal isolation unit 180 is configured to prevent an interruption from the current feedback circuit 170. On the contrary, when the current feedback circuit 170 outputs the feedback signal, the signal isolation unit 180 is configured to prevent an interruption from the voltage feedback circuit 160.

In one embodiment, when the current detection circuit 120 detects that the output current of the load 300 is less than the predetermined current of the current detection circuit 120, the voltage feedback circuit 160 transmits the feedback signal to the voltage conversion circuit 110 through the signal isolation unit 180 according to the output voltage of the voltage conversion circuit 110. As such, the voltage conversion circuit 110 adopts a constant voltage mode. In another embodiments, when the voltage detection circuit 130 detects that the output voltage is larger than the predetermined voltage and the current detection circuit 120 detects that the output current of the load 300 is less than the predetermined current of the current detection circuit 120, the voltage feedback circuit 160 outputs the constant voltage feedback signal to the signal isolation unit 180. Subsequently, the signal isolation unit 180 transmits the feedback signal to the voltage conversion circuit 110, such that the voltage conversion circuit 110 adopts the constant voltage mode.

In some embodiments, when the voltage detection circuit 130 detects that the output voltage is larger than the predetermined voltage, and when the current detection circuit 120 detects the output current of the load 300 is larger than the predetermined current of the current detection circuit 120, the current feedback circuit 170 outputs the constant current feedback signal to the signal isolation unit 180. Subsequently, the signal isolation unit 180 transmits the feedback signal to the voltage conversion circuit 110, such that the voltage conversion circuit 110 adopts a constant current mode.

Figure 2:
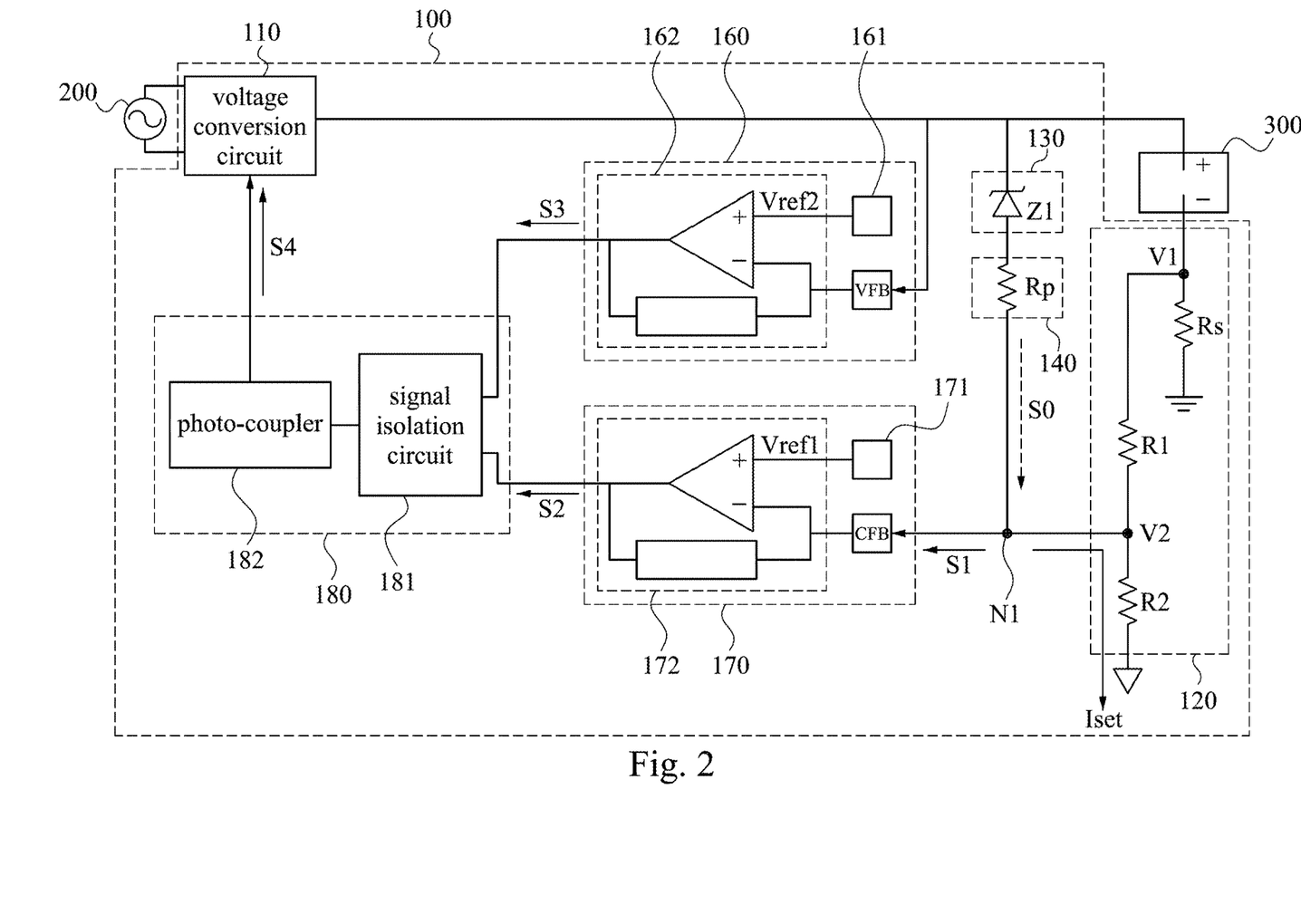
FIG. 2 is a circuit diagram of a constant power protection circuit according to some embodiments of the present disclosure.

FIG. 2 is a circuit diagram of a constant power protection circuit 100 according to some embodiments of the present disclosure. As shown in FIG. 2, the current detection circuit 120 includes a detect resistor Rs, a first resistor R1, and a second resistor R2. The detect resistor Rs of the current detection circuit 120 is regarded as a detect circuit, and the detect resistor Rs is configured to detect the output current of the load 300. In some embodiments, a predetermined current Iset is a current which flows from a node N1 to the second resistor R2. The embodiment is merely an example used in the following description for illustration purpose, and the present disclosure is not limited thereto.

As shown in FIG. 2, when the output current of the load 300 flows through the detect resistor Rs, a first voltage V1 is generated. When the predetermined current Iset flows through the second resistor R2, a second voltage V2 is generated. In some embodiments, when the output current of the load 300 is larger than the predetermined current Iset, the first voltage V1 is larger than the second voltage V2. On the contrary, when the output current of the load 300 is less than the predetermined current Iset, the first voltage V1 is less than the second voltage V2. The generating manner of the predetermined current Iset will be described in detail as follows.

Reference is now made to FIG. 2. The voltage detection circuit 130 includes a Zener Diode Z1. A cathode terminal of the Zener diode Z1 is coupled to the voltage conversion circuit 110, and an anode terminal of the Zener diode Z1 is coupled to the power setting circuit 140. Since Zener Diode Z1 has a constant breakdown voltage, the breakdown voltage of the Zener Diode Z1 is therefore used as a voltage point of the constant current in the present disclosure.

As shown in FIG. 2, the resistor Rp is regarded as but not limited to the power setting circuit 140. The resistor Rp is coupled between the anode terminal of the Zener diode Z1 and the node N1. If the output voltage of the voltage conversion circuit 110 is larger than the breakdown voltage of the Zener diode Z1, a current is generated and flows through the resistor Rp. The current flows through the resistor Rp is regarded as a current point which is used to set the constant power of the power setting circuit 140.

In some embodiments, the resistor value of the resistor Rp of the power setting circuit 140 can be set according to actual requirements. The resistor value of the resistor Rp can be one of a first resistor value and a second resistor value. When the resistor value of the resistor Rp is the first resistor value, the power setting circuit 140 outputs a first setting power. When the resistor value of the resistor Rp is the second resistor, the power setting circuit 140 outputs a second setting power.

As shown in FIG. 2, a setting value of the constant power obtained according to the voltage point detected by the voltage detection circuit 130 and the current point of the power setting circuit 140 is a setting signal S0. The setting signal S0 outputted by the power setting circuit 140 is a current, and the current flows through the second resistor R2. In this embodiment, the current is set to be but not limited to the predetermined current Iset.

In some embodiments, as shown in FIG. 2, the current feedback circuit 170 is coupled to the resistor Rp and the second resistor R2. When the predetermined current Iset flows through the second resistor R2 of the current detection circuit 120, the predetermined current Iset and the second resistor R2 generates the second voltage V2. The second voltage V2 is regarded as a comparison signal S1 and is transmitted to the current feedback circuit 170. The current feedback circuit 170 generates a constant current feedback signal S2 to the signal isolation unit 180 according to the comparison signal S1. Subsequently, the signal isolation unit 180 transmits the feedback signal to the voltage conversion circuit 110, such that the voltage conversion circuit 110 adopts the constant current mode.

As shown in FIG. 2, the current feedback circuit 170 includes a current feedback amplifier CFB, a first reference voltage generation circuit 171, and a first comparator 172. The current feedback amplifier CFB is configured to receive the comparison signal S1. The output terminal of the current feedback circuit 170 is coupled to the signal isolation unit 180. The signal isolation unit 180 is configured to transmit the output signal of the current feedback circuit 170 to the voltage conversion circuit 110.

As shown in FIG. 2, the second voltage V2 is regarded as the comparison signal S1 and is transmitted to the current feedback amplifier CFB of the current feedback circuit 170. The first comparator 172 receives a first reference voltage Vref1 of the first reference voltage generation circuit 171 and the comparison signal S1 received by the current feedback amplifier CFB. When the comparison signal S1 is larger than the first reference voltage Vref1, the first comparator 172 outputs the constant current feedback signal S2 to the signal isolation unit 180, such that the voltage conversion circuit 110 adopts the constant current mode.

Reference is now made to FIG. 2. The voltage feedback circuit 160 includes a voltage feedback amplifier VFB, a second reference voltage generation circuit 161, and a second comparator 162. The voltage feedback amplifier VFB is coupled to the voltage conversion circuit 110. The output voltage of the voltage conversion circuit 110 is transmitted to the voltage feedback amplifier VFB. The output terminal of the voltage feedback circuit 160 is coupled to the signal isolation unit 180. The signal isolation unit 180 is configured to transmit the output signal of the voltage feedback circuit 160 to the voltage conversion circuit 110.

Referring to FIG. 2, when the current feedback circuit 170 does not output the constant current feedback signal S2, the voltage feedback amplifier VFB of the voltage feedback circuit 160 receives the output voltage of the voltage conversion circuit 110. The second comparator 162 receives the second reference voltage Vref2 of the second reference voltage generation circuit 161 and the output voltage received by the voltage feedback amplifier VFB. When the output voltage is larger than the second reference voltage Vref2, the second comparator 162 outputs a constant voltage feedback signal S3 to the signal isolation unit 180, such that the voltage conversion circuit 110 adopts the constant voltage mode.

Reference is now made to FIG. 2. The signal isolation unit 180 includes a signal isolation circuit 181 and a photo-coupler 182. The photo-coupler 182 is coupled between the signal isolation circuit 181 and the voltage conversion circuit 110. In some embodiments, the signal isolation circuit 181 is configured to isolate the voltage feedback circuit 160 and the current feedback circuit 170. When the voltage feedback circuit 160 outputs the constant voltage feedback signal S3, the signal isolation circuit 181 is configured to prevent an interruption of the current feedback circuit 170. On the contrary, when the current feedback circuit 170 outputs the constant current feedback signal S2, the signal isolation circuit 181 is configured to prevent an interruption of the voltage feedback circuit 160.

In some embodiments, when the photo-coupler 182 receives the constant current feedback signal S2 or the constant voltage feedback signal S3, a feedback signal S4 is outputted to the voltage conversion circuit 110. The voltage conversion circuit 110 adjusts a value of the voltage or a value of the current which is outputted to the load 300 according to the feedback signal S4 so as to achieve a constant power output.

In one embodiment, as shown in FIG. 2, if the output current of the load 300 is less than or equal to the predetermined current Iset, the first voltage V1 is less than or equal to the second voltage V2. Therefore, there is no current flowing through the first resistor R1 to the second resistor R2. The value of the second voltage V2 is a product of the second resistor R2 and the predetermined current Iset. The second voltage V2 is regarded as the comparison signal S1 and is transmitted to the current feedback circuit 170. Since the voltage of the comparison signal S1 is less than the first reference voltage Vref1, the current feedback circuit 170 does not output the constant current feedback signal S2. As a result, the voltage feedback circuit 160 generates the constant voltage feedback signal S3 according to a value of the output voltage of the voltage conversion circuit 110.

In some embodiments, reference is now made to FIG. 2, when the output voltage of the voltage conversion circuit 110 is larger than the second reference voltage Vref2, the voltage feedback circuit 160 generates the constant voltage feedback signal S3. In one embodiment, when the voltage feedback circuit 160 outputs the constant voltage feedback signal S3 to the signal isolation circuit 181, the signal isolation circuit 181 is configured to prevent an interruption of the current feedback circuit 170. The photo-coupler 182 outputs the feedback signal S4 to the voltage conversion circuit 110 according to the constant voltage feedback signal S3. The voltage conversion circuit 110 adopts the constant voltage mode according to the feedback signal S4.

In some embodiments, as shown in FIG. 2, the output voltage of the voltage conversion circuit 110 is larger than the breakdown voltage of the Zener diode Z1, and the output current is less than or equal to the predetermined current Iset. The power setting circuit 140 generates a setting signal S0 to the second resistor R2. Since the output current of the load 300 is less than or equal to the predetermined current Iset, the first voltage V1 is therefore less than or equal to the second voltage V2. As such, there is no current which flows through the first resistor R1 to the second resistor R2. The values of the second voltage V2 is a product of the second resistor R2 and the predetermined current Iset. The second voltage V2 is regarded as the comparison signal S1 and is transmitted to the current feedback circuit 170. At this time, since the voltage of the comparison signal S1 is still less than the first reference voltage Vref1, the current feedback circuit 170 does not output the constant current feedback signal S2. As a result, the voltage feedback circuit 160 generates the constant voltage feedback signal S3 according to a value of the output voltage of the voltage conversion circuit 110.

In some embodiments, reference is now made to FIG. 2, when the output voltage of the voltage conversion circuit 110 is larger than the second reference voltage Vref2, the voltage feedback circuit 160 generates the constant voltage feedback signal S3. Reference is now made to FIG. 2, when the voltage feedback circuit 160 outputs the constant voltage feedback signal S3 to the signal isolation circuit 181, the signal isolation circuit 181 is configured to prevent an interruption of the feedback current feedback circuit 170. The photo-coupler 182 outputs the feedback signal S4 to the voltage conversion circuit 110 according to the constant voltage feedback signal S3. The voltage conversion circuit 110 adopts the constant voltage mode according to the feedback signal S4.

Figure 3:
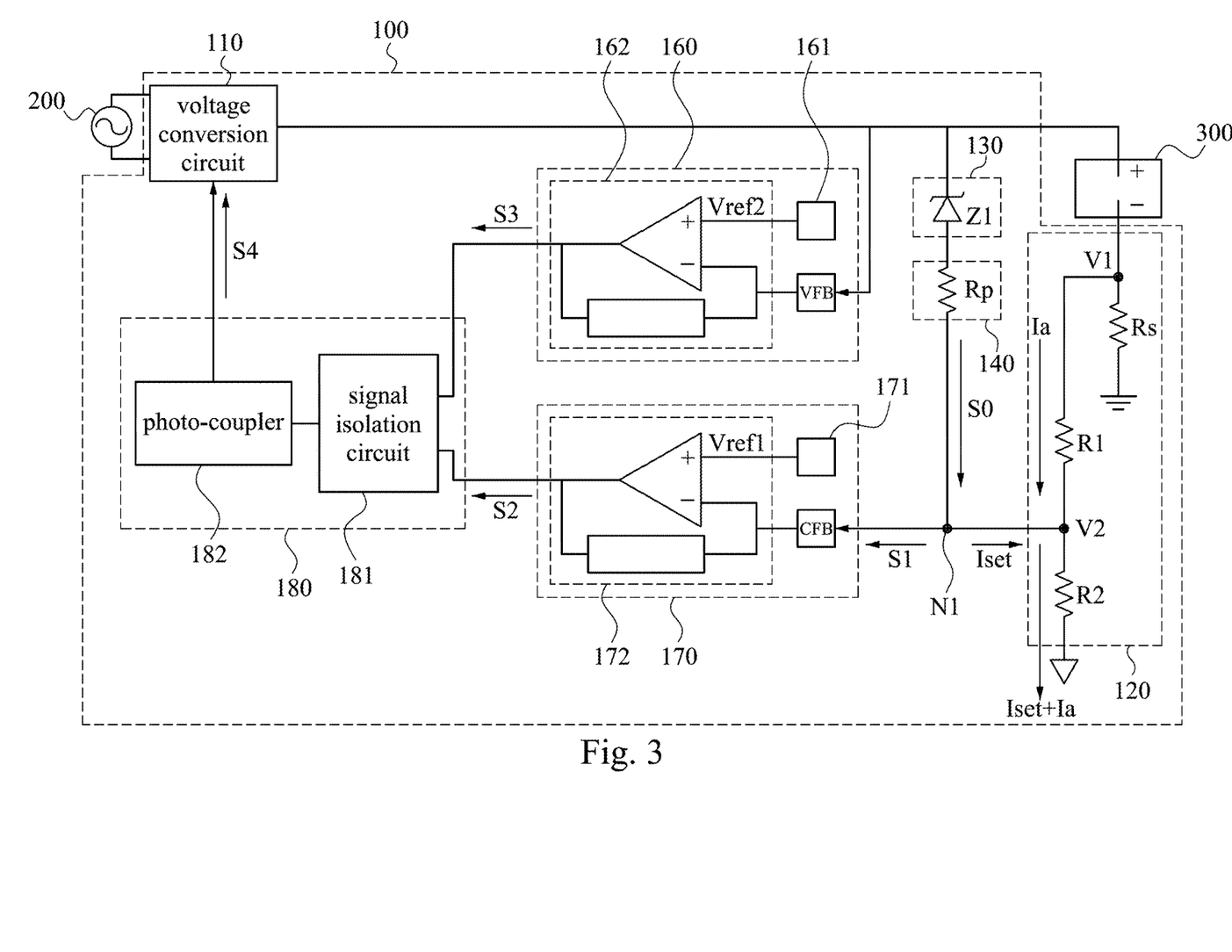
FIG. 3 is a circuit diagram of a constant power protection circuit according to some embodiments of the present disclosure.

FIG. 3 is a circuit diagram of a constant power protection circuit 100 according to some embodiments of the present disclosure. As shown in FIG. 3, the output voltage of the voltage conversion circuit 110 is larger than the breakdown voltage of the Zener diode Z1, and the output current of the load 300 is larger than or equal to the predetermined current Iset. As this time, the output voltage of the voltage conversion circuit 110 is larger than the Zener diode Z1, and the Zener diode Z1 therefore generates a voltage, such that the resistor Rp generates the setting signal S0 to the second resistor R2. As shown in FIG. 3, since the output current of the voltage conversion circuit 110 is larger than the predetermined current Iset, the first voltage V1 is therefore larger than the second voltage V2. Hence, the first resistor R1 generates a current Ia to the second resistor R2. The value of the second voltage V2 is a product of the second resistor R2 and the predetermined current Isetand current Ia. Since the current flowing through the second resistor R2 becomes larger, such that the second voltage V2 is increased.

Referring to FIG. 3, after the second voltage V2 is increased as discuss above, the second voltage V2 is regarded as the comparison signal S1 and is transmitted to the current feedback circuit 170. At this time, since the voltage of the comparison signal S1 is larger than the first reference voltage Vref1, the current feedback circuit 170 outputs the constant current feedback signal S2. Meanwhile, the voltage feedback circuit 160 does not output the constant voltage feedback signal S3.

As can be seen in FIG. 3, when the current feedback circuit 170 outputs the constant current feedback signal S2 to signal isolation circuit 181, the signal isolation circuit 181 is configured to prevent an interruption of the voltage feedback circuit 160. The photo-coupler 182 outputs the feedback signal S4 to the voltage conversion circuit 110 according to the constant current feedback signal S2. The voltage conversion circuit 110 adopts the constant current mode according to the feedback signal S4.

In some embodiments, the voltage conversion circuit 110 adopts the constant current mode in the following conditions. When the output voltage is less than the voltage of the voltage detection circuit 130 and the output current is larger than the current of the current detection circuit 120, the voltage conversion circuit 110 adopts the constant current mode. Since the output voltage is less than the breakdown voltage of the Zener diode Z1, there is no current which flows through the Zener diode Z1 and the resistor Rp. At this time, the resistors R1 and R2 of the current detection circuit 120 bias the output voltage for setting the constant current point, and the current feedback circuit 170 outputs a constant current feedback signal to the signal isolation unit 180, such that the voltage conversion circuit 110 adopts the constant current mode.

Figure 4:
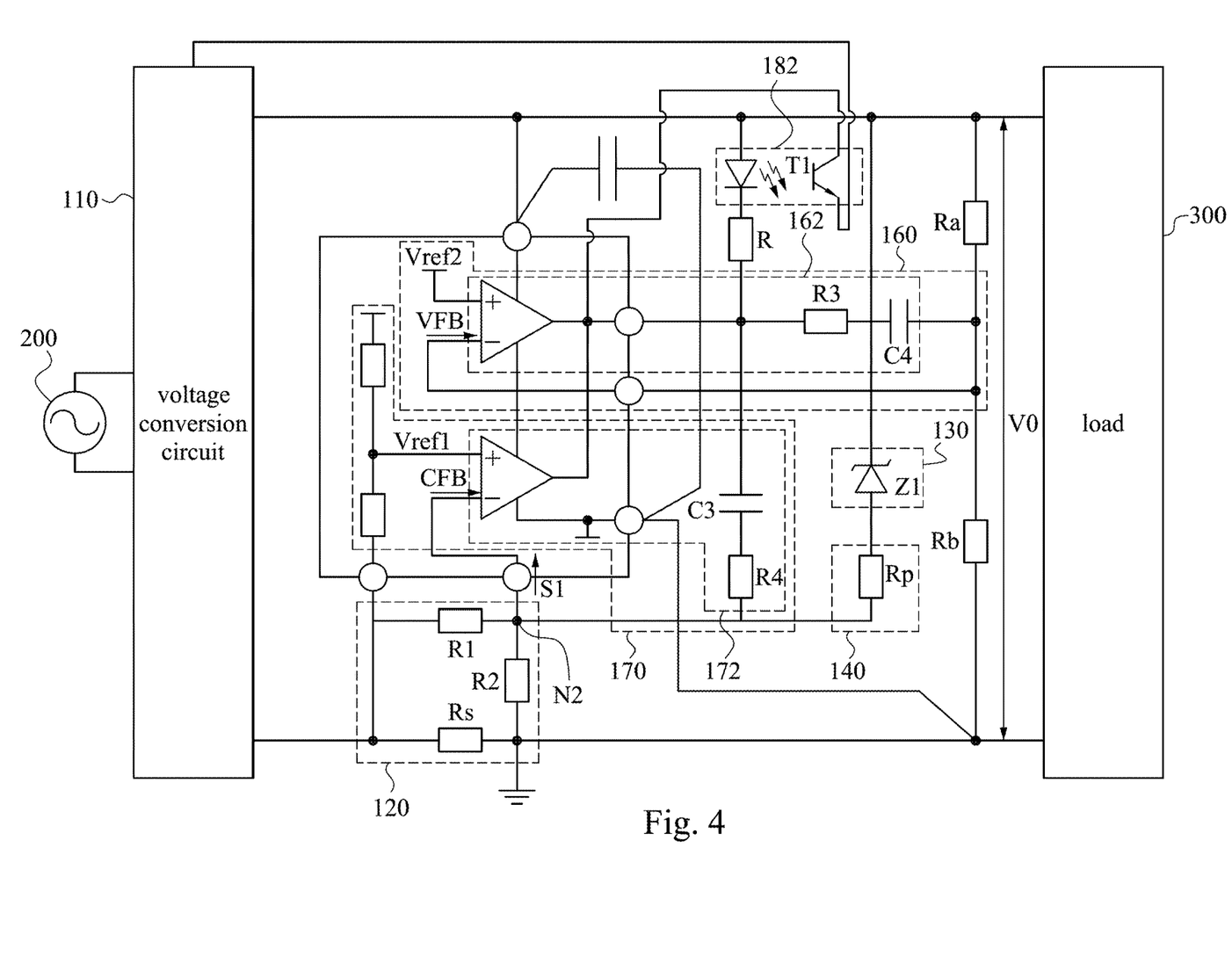
FIG. 4 is a circuit diagram of a constant power protection circuit according to some embodiments of the present disclosure.

Reference is now made to FIG. 4. FIG. 4 is a specific circuit diagram of a constant power protection circuit 100 according to some embodiments of the present disclosure. In this embodiment, the implements of the circuit blocks in FIGS. 2, 3 are illustrated in detailed. The current detection circuit 120 can be implemented by resistors R1, R2, RS. The voltage detection circuit 130 can be implemented by a Zener diode Z1. The power setting circuit 140 can be implemented by a resistor Rp. The current flowing through the resistor Rp and the current provided by the resistor R1, R2 converge at a node N2, and is provided to an operational amplifier. The second comparator 162 of the voltage feedback circuit 160 can be implemented by an operational amplifier, a resistor R3 and a capacitor C4. The second reference voltage Vref2 of the voltage feedback circuit 160 corresponds to the reference voltage Vref2 in FIG. 4. The first comparator 172 of the current feedback circuit 170 can be implemented by an operational amplifier, a resistor R4, and a capacitor C3. The first reference voltage Vref1 of the current feedback circuit 170 corresponds to the reference voltage Vref1 in FIG. 4. The photo-coupler 182 of the signal isolation unit 180 and the signal isolation circuit 181correspond to the photo-coupler 182 and a power semiconductor T1 in FIG. 4. The circuit configurations, the connections, and the operations are discussed in the foregoing description, and a detailed illustration will be omitted herein for the sake of brevity.

Figure 5:
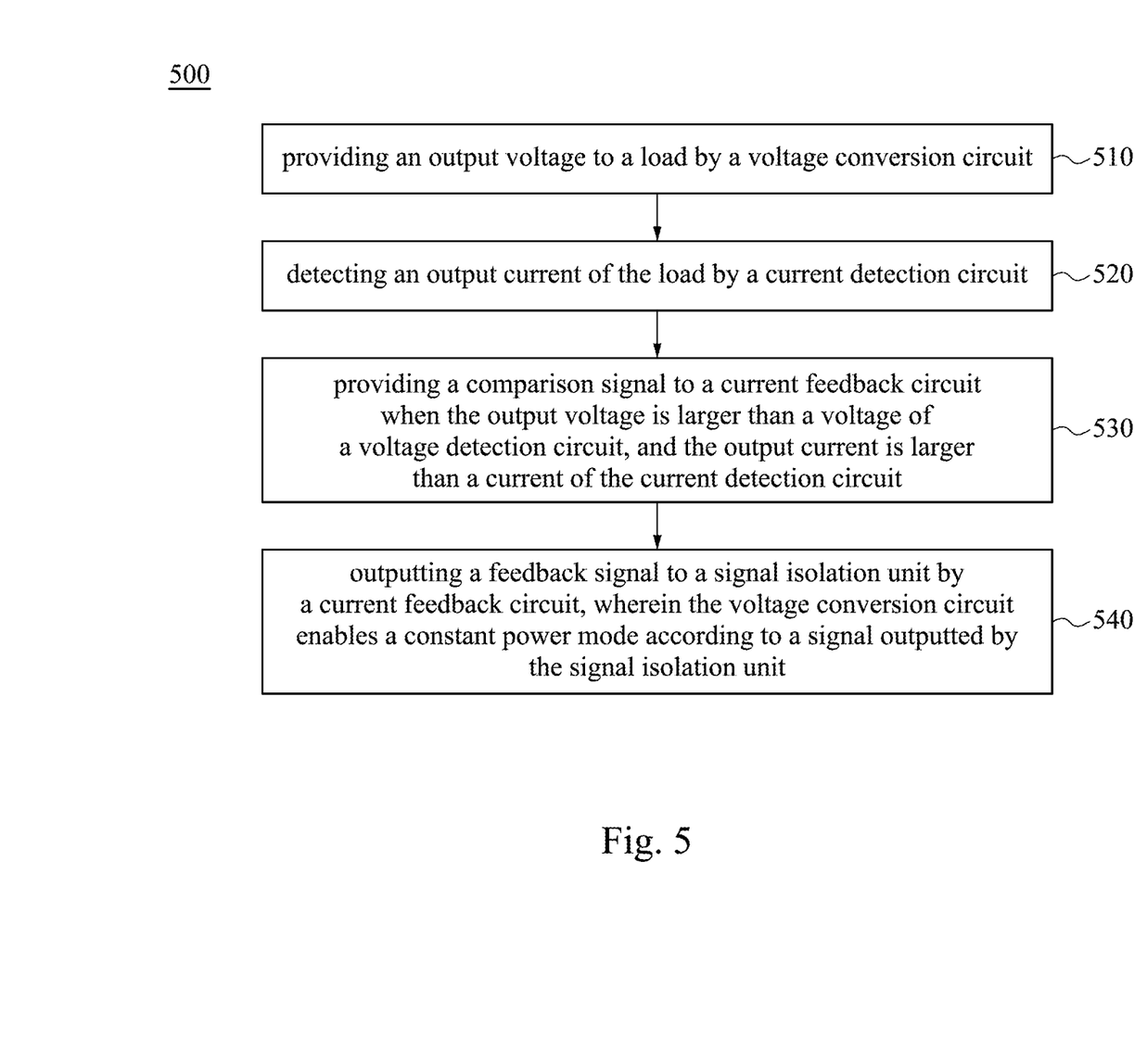
FIG. 5 is a flow chart of a constant power protection method according to some embodiments of the present disclosure.

FIG. 5 is a flow chart of a constant power protection method according to some embodiments of the present disclosure.

For facilitating the understanding of the constant power protection method 500, reference is now made to both FIG. 1 and FIG. 5. However, the implement of the constant power protection method 500 of the present disclosure is not limited to the configuration of the circuit as shown in FIG. 1, and the configuration of the circuit as shown in FIG. 1 is merely used for illustration. The constant power protection method 500 in FIG. 5 includes the steps as follows:

Step 510: providing an output voltage to a load by a voltage conversion circuit;

Step 520: detecting an output current of the load by a current detection circuit;

Step 530: providing a comparison signal to a current feedback circuit when the output voltage is larger than a voltage of a voltage detection circuit, and the output current is larger than a current of the current detection circuit; and Step 540: outputting a feedback signal to a signal isolation unit by a current feedback circuit, wherein the voltage conversion circuit enables a constant power mode according to a signal outputted by the signal isolation unit.

In step 510, the voltage conversion circuit 110 in FIG. 1 is used to provide the output voltage to the load 300. In step 520, the current detection circuit 120 in FIG. 1 is used to detect the output current of the load 300.

In step 530, when the output voltage is larger than the voltage of the voltage detection circuit and the output current is larger than the current of the current detection circuit, the addition circuit 150 in FIG. 1 is used to provide the comparison signal to the current feedback circuit 170.

In step 540, the current feedback circuit 170 in FIG. 1 is used to output the feedback signal to the signal isolation unit 180, wherein the voltage conversion circuit 110 enables the constant power mode according to the signal outputted by the signal isolation unit 180.

In one embodiment, the constant power protection method 500 further includes: outputting a constant voltage feedback signal to the signal isolation unit by a voltage feedback circuit when the output current is less than the current of the current detection circuit. Referring to FIG. 1, when the output current is less than the current of the current detection circuit 120, the voltage feedback circuit 160 is used to output the constant voltage feedback signal to the signal isolation unit 180, such that the voltage conversion circuit 110 adopts a constant voltage mode.

In another embodiment, the constant power protection method 500 further includes: outputting the constant voltage feedback signal to the signal isolation unit by the voltage feedback circuit when the output voltage is larger than the voltage of the voltage detection circuit and the output current is less than the current of the current detection circuit. Referring to FIG. 1, when the output voltage is larger than the voltage of the voltage detection circuit, and the output current is less than the current of the current detection circuit, the voltage feedback circuit 160 is used to output a constant voltage feedback signal to the signal isolation unit 180, such that the voltage conversion circuit 110 adopts the constant voltage mode.

In some embodiments, the constant power protection method 500 further includes: outputting a constant current feedback signal to the signal isolation unit by the current feedback circuit when the output voltage is less than the voltage of the voltage detection circuit and the output current is larger than the current of the current detection circuit. Referring to FIG. 1, when the output voltage is less than the voltage of the voltage detection circuit, and the output current is larger than the current of the current detection circuit, the current feedback circuit 170 is used to output the constant current feedback signal to the signal isolation unit 180, such that the voltage conversion circuit 110 adopts the constant current mode.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A constant power protection circuit, comprising:
a voltage conversion circuit configured to provide an output voltage to a load;
a current detection circuit coupled to the voltage conversion circuit, and configured to detect an output current of the load;
a voltage detection circuit coupled to the current detection circuit and the voltage conversion circuit;
a power setting circuit coupled to the voltage detection circuit;
a voltage feedback circuit coupled to the voltage detection circuit;
an addition circuit coupled to the power setting circuit;
a current feedback circuit coupled to the addition circuit; and
a signal isolation unit coupled to the voltage feedback circuit and the current feedback circuit;
wherein, when the output voltage is larger than a voltage of the voltage detection circuit and the output current is larger than a current of the current detection circuit, the power setting circuit provides a comparison signal to the current feedback circuit, the current feedback circuit outputs a feedback signal to the signal isolation unit, and the voltage conversion circuit enables a constant power mode according to a signal outputted from the signal isolation unit,
wherein the current feedback circuit comprises a current feedback amplifier (CFB), a first reference voltage generation circuit, and a first comparator.

2. The constant power protection circuit of claim 1, wherein the voltage feedback circuit comprises a voltage feedback amplifier (VFB), a second reference voltage generation circuit, and a second comparator.

3. The constant power protection circuit of claim 1, wherein when the output current is less than the current of the current detection circuit, the voltage feedback circuit outputs a constant voltage feedback signal to the signal isolation unit.

4. The constant power protection circuit of claim 3, wherein when the output voltage is larger than the voltage of the voltage detection circuit and the output current is less than the current of the current detection circuit, the voltage feedback circuit outputs the constant voltage feedback signal to the signal isolation unit.

5. The constant power protection circuit of claim 1, wherein when the output voltage is less than the voltage of the voltage detection circuit and the output current is larger than the current of the current detection circuit, the current feedback circuit outputs a constant current feedback signal to the signal isolation unit.

6. The constant power protection circuit of claim 1, wherein the addition circuit comprises an adder, the adder is configured to add a setting signal of the power setting circuit and a signal of the current detection circuit to generate and transmit an output signal to the current feedback circuit.

7. The constant power protection circuit of claim 1, wherein the voltage detection circuit comprises:
 a Zener diode comprising:
  a cathode terminal coupled to the voltage conversion circuit; and
  an anode terminal;
 wherein the power setting circuit comprises:
  a resistor coupled between the anode terminal of the Zener diode and the addition circuit.

8. The constant power protection circuit of claim 7, wherein a resistor value of the resistor of the power setting circuit comprises one of a first resistor value and a second resistor value, wherein when the resistor is the first resistor value, the power setting circuit outputs a first setting power, wherein when the resistor is the second resistor, the power setting circuit outputs a second setting power.

9. A constant power protection method, applied to a constant power protection circuit, wherein the constant power protection circuit comprises a voltage conversion circuit, a current detection circuit, a voltage detection circuit, a current feedback circuit, and a signal isolation unit, wherein the voltage detection circuit is coupled to the current detection circuit and the voltage conversion circuit, the current feedback circuit is coupled to the voltage detection circuit and the current detection circuit, and the signal isolation unit is coupled to the current feedback circuit, wherein the constant power protection method comprises:
 providing an output voltage to a load by the voltage conversion circuit;
 detecting an output current of the load by the current detection circuit;
 providing a comparison signal to the current feedback circuit when the output voltage is larger than a voltage of the voltage detection circuit and the output current is larger than a current of the current detection circuit;
 outputting a feedback signal to the signal isolation unit by the current feedback circuit, wherein the voltage conversion circuit enables a constant power mode according to a signal outputted by the signal isolation unit; and
 outputting a constant voltage feedback signal to the signal isolation unit, by a voltage feedback circuit, when the output current is less than the current of the current detection circuit.

10. The constant power protection method of claim 9, wherein outputting the constant voltage feedback signal to the signal isolation unit, by the voltage feedback circuit, when the output current is less than the current of the current detection circuit comprises:
 outputting the constant voltage feedback signal to the signal isolation unit, by the voltage feedback circuit, when the output voltage is larger than the voltage of the voltage detection circuit and the output current is less than the current of the current detection circuit.

11. The constant power protection method of claim 9, further comprising:
 outputting a constant current feedback signal to the signal isolation unit, by the current feedback circuit, when the output voltage is less than the voltage of the voltage detection circuit and the output current is larger than a current of the current detection circuit.

\* \* \* \* \*